United States Patent [19]

Bregman et al.

[11] Patent Number: 5,786,986

[45] Date of Patent: Jul. 28, 1998

[54] MULTI-LEVEL CIRCUIT CARD STRUCTURE

[75] Inventors: Mark Fielding Bregman, Ridgefield, Conn.; Stephen Leslie Buchwalter, Wappingers Falls, N.Y.; Karl Hermann, Austin, Tex.; Caroline Ann Kovac, Ridgefield, Conn.; Paige Adams Poore, Durham, N.C.; Alfred Viehbeck, Stormville, N.Y.

[73] Assignee: International Business Machines Corporation, Armonk, N.Y.

[21] Appl. No.: 283,922

[22] Filed: Aug. 1, 1994

Related U.S. Application Data

[63] Continuation of Ser. No. 128,331, Sep. 29, 1993, abandoned, which is a continuation of Ser. No. 339,334, Apr. 17, 1989, abandoned.

[51] Int. Cl.[6] .................................................. H05K 7/20
[52] U.S. Cl. ......................... 361/719; 174/252; 361/790; 361/803
[58] Field of Search ....................... 174/252; 361/704, 361/707, 708, 712, 713, 717–722

[56] References Cited

U.S. PATENT DOCUMENTS

| | | | |
|---|---|---|---|
| 3,165,672 | 1/1965 | Gellert | 361/387 |
| 3,436,819 | 4/1969 | Lunine . | |
| 3,514,538 | 5/1970 | Chadwick et al. | 361/387 |
| 3,606,677 | 9/1971 | Ryan . | |
| 3,705,332 | 12/1972 | Parks | 361/414 |
| 3,795,047 | 3/1974 | Abolafia et al. . | |
| 4,155,321 | 5/1979 | Tamburro . | |
| 4,249,302 | 2/1981 | Crepeau . | |
| 4,283,754 | 8/1981 | Parks | 361/386 |
| 4,496,793 | 1/1985 | Hanson et al. . | |
| 4,522,880 | 6/1985 | Klostermeier et al. . | |
| 4,591,220 | 5/1986 | Impey . | |
| 4,683,653 | 8/1987 | Iwasa . | |
| 4,711,822 | 12/1987 | Choye et al. . | |
| 4,739,448 | 4/1988 | Rowe et al. | 361/719 |
| 4,783,722 | 11/1988 | Osaki et al. | 361/412 |
| 4,803,450 | 2/1989 | Burgess et al. | 361/414 |

FOREIGN PATENT DOCUMENTS

| | | | |
|---|---|---|---|
| 0028657 | 11/1980 | European Pat. Off. . | |
| 0570712 | 12/1975 | Switzerland | 439/91 |
| 1136753 | 12/1968 | United Kingdom . | |
| 2137422 | 10/1984 | United Kingdom . | |

*Primary Examiner*—Gregory D. Thompson
*Attorney, Agent, or Firm*—Daniel P. Morris

[57] ABSTRACT

Structure for mounting electronic devices thereon. The structure is fabricated from a plurality of substrates each having a thermally and/or electrically conductive core surrounded by a dielectric material. The substrates can be adherently placed together with the electrically conductive cores providing ground and power planes or the substrates can be mounted together with connectors electrically interconnecting adjacent substrates and spacing the adjacent substrates apart providing a space through which a fluid can flow to extract heat generated by the electronic devices mounted thereon. The conductive cores provide both power and ground planes to the structure and a means for thermally dissipating the generated heat.

24 Claims, 4 Drawing Sheets

FIG. 3
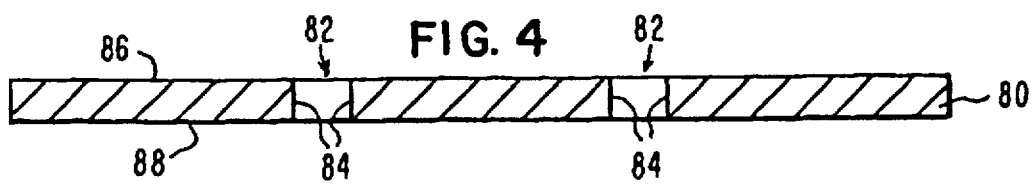
FIG. 4
FIG. 5
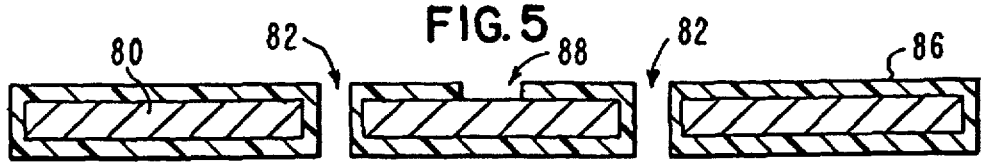
FIG. 6
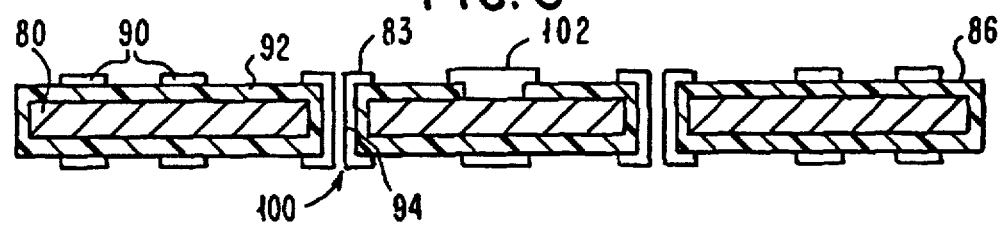
FIG. 7
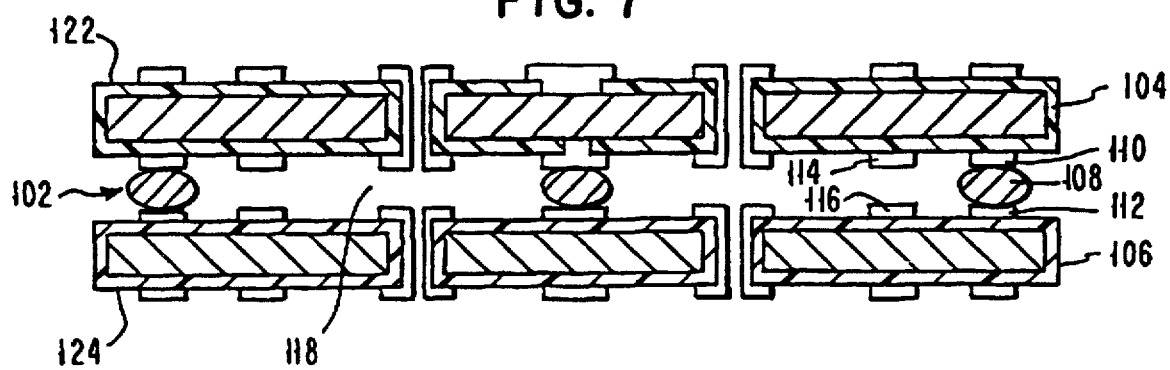

MULTI-LEVEL CIRCUIT CARD STRUCTURE

This is a continuation of application Ser. No. 08/128,331, Now abandoned filed, Sep. 29, 1993 Which is a continuation of application Ser. No. 07/339,334,filed Apr. 17, 1989 now abandoned.

FIELD OF THE INVENTION

This invention relates to a multi-level circuit card structure for mounting an electronic device thereon. More particularly, this invention relates to a multi-level circuit card structure formed from a plurality of substrates having thermally and/or electrically conductive cores which can be mounted together or which can be electrically interconnected by conductors which maintain adjacent substrates spaced apart to permit a cooling medium to pass therethrough.

BACKGROUND OF THE INVENTION

In electronic computers, electronic devices or modules housing electronic devices are mounted on circuit cards which electrically interconnect the electronic devices and modules. Multi-layer circuit cards are conventionally manufactured by laminating together a number of substrates, i.e. epoxy/fiberglass, having copper circuitry on each side. The multi-layer laminate is then drilled to form the many vias for interlayer connections. Registration of the cores must be extremely precise because misalignment will lead to an unusable circuit card. The electrical performance of the circuit card depends on many factors. The one important limitation is the dielectric constant of the epoxy/fiberglass. Thermal performance of the multi-layer card is poor because the thermal conductivity of the epoxy/fiberglass is very low. Therefore, semiconductor chips which generate a large amount of heat while in operation cannot be mounted directly to the epoxy/fiberglass card. Thus, the excess heat from the integrated circuit has to be dissipated at another level of packaging, the chip carrier or module.

The dissipation of heat generated in low end circuit cards is becoming a greater problem as integration of electronic components progresses. Conventional circuit cards with epoxy or other organic materials as the dielectric have poor thermal characteristics, so that heat cannot be efficiently conducted out of the system. This limits either the power or the number of chips that can be put onto a card. One solution to this problem is to make the card out of materials with high thermal conductivity, however, the dielectric materials that have high thermal conductivity, such as beryllium oxide, are expensive. An alternative way is to use a thermally conductive material coated with a relatively thin layer of dielectric material.

U.S. Pat. No. 3,606,677 describes a multilayer structure formed by laminating dielectric substrates having conductor patterns thereon with unmetallized substrates therebetween.

U.S. Pat. No. 3,795,047 describes a multilayer structure formed by laminating subassemblies electrically interconnected by uniform spherical particulate powder embedded in an epoxy between adjacent layers.

U.S. Pat. No. 4,683,653 describes a multilayer circuit board formed from laminated dielectric base plates with circuits thereon.

U.S. Pat. No. 3,436,819 describes a multilayer circuit board formed from laminating circuitized dielectric substrates.

U.S. Pat. No. 4,496,793 describes a multilayer circuit board including one or more metal stabilizing sheets for adjusting the thermal coefficient of expansion of the laminate.

Unlike the structures of the present invention, the prior art structures are not fabricated from substrates formed from a thermally and/or electrically conductive core coated with a dielectric material. The core provides structural stability to each substrate. The structures of the present invention which are fabricated from a plurality of these substrates, therefore, have enhanced structural stability. Where the core is electrically conductive, the core can be used as a ground or power plane, thereby eliminating the need to separately include a conductive layer or sheet as a ground or power plane. Where the core is thermally conducting, since each substrate has a core, the structure itself can function as a heat sink to dissipate heat generated by an electronic device mounted thereon.

It is an object of this invention to provide a structure upon which an integrated circuit electronic device can be mounted, wherein the structure is fabricated from a plurality of substrates having a thermally and/or electrically conductive core.

It is another object of this invention to provide a structure upon which an integrated circuit electronic device can be mounted wherein the structure provides a means for dissipating heat generated by the electronic device.

It is another object of this invention to provide a low dielectric constant circuit card by using low dielectric materials and by providing air spaces between substrates which make up the multi-layer circuit card by disposing between adjacent substrates means for electrically interconnecting adjacent substrates which also keep the adjacent substrates spaced apart.

Summary of the Invention

In its broadest aspects, the invention herein is a structure having a plurality of substrates each of which has a first and second major surface. The substrate are formed from at least one thermally and/or electrically conductive core covered with a dielectric material. An electrically conductive pattern can be selectively formed on the major surfaces of each substrate.

In a particular aspect of the present invention, a major surface of one of the substrates is placed facing a major surface of an adjacent substrate in the structure. Between adjacent substrates there is a plurality of connectors. At least a part of the plurality of connectors electrically interconnect at least a part of the conductor patterns on the major surfaces of the adjacent substrates. The connector maintains a space between the major surfaces of the adjacent substrates.

In another particular aspect of the present invention, a major surface of one of the substrates is placed facing and adheres to a major surface of an adjacent substrate in the structure. There is a conductor pattern on at least one of the outside major surfaces of the structure. Conductive through holes provide electrical connection between at least two of the group consisting of the conductor pattern on the end major surfaces, and an electrically conductive core of at least one of the substrates.

In another particular aspect of the present invention, a structure contains a plurality of assemblies electrically interconnected and spaced apart by a plurality of connectors. Each assembly contains a plurality of substrates.

A major surface of one of the substrates is placed facing and adheres to a major surface of an adjacent substrate in the structure. There is a conductor pattern on at least one of the outside major surfaces of the assembly. Conductive through holes provide electrical connection between at least two of the group consisting of the conductor pattern on the outside major surfaces and an electrically conductive core of at least one of the substrates.

In a more particular aspect of the present invention, an electronic device is electrically mounted onto the multi-layer structure.

In another more particular aspect of the present invention, substrates having conductive patterns on both major surfaces are electrically interconnected by electrically conducting through holes in the substrates.

These and other objects, features and advantages will be apparent from the following more particular description of the preferred embodiments.

BRIEF DESCRIPTION OF THE DRAWING

FIG. 3-7 shows a method for fabricating metal core substrates used in the preferred embodiment of the invention.

Description of the preferred Embodiments

Figure 1:
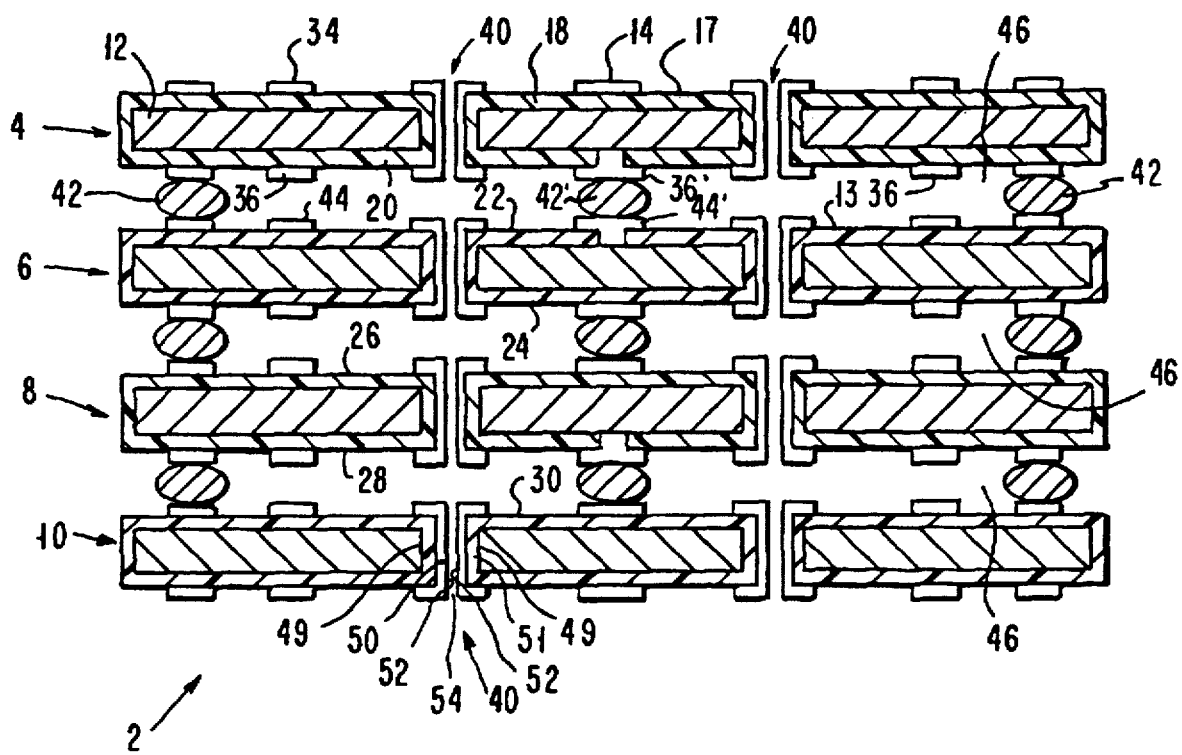
FIG. 1 diagrammatically shows a multi-layer structure of the present invention wherein adjacent substrates are electrically interconnected and spaced apart by a plurality of connectors.

FIG. 1 shows structure 2 formed from substrates 4, 6, 8 and 10. Each substrate has a thermally conductive core 12. Thermally conductive core 12 is preferably made of a high thermally conductive material such as a metal but is not limited thereto. Typical metals are copper, aluminum, iron, copper-invar-copper and the like. Invar is an iron-nickel alloy. The core typically has a thickness from about 0.1 mils to about 40 mils, preferable from about 0.1 to about 10 mils, most preferably from about 0.1 mils to about 5 mils. The metal core can be chosen to give each substrate a thermal coefficient of expansion closely matched to that of material from which an electronic device mounted on the structure of FIG. 1, is fabricated from. Typically, an electronic device is fabricated from a material like silicon or gallium arsenide. In the case of a silicon electronic device, examples of metal core 12 providing a thermal coefficient of expansion closely matched to that of silicon are copper-invar-copper and molybdenum. The core can also be copper, aluminum and any other metal. A core 12 with a thermal coefficient of expansion closely matched to the electronic device mounted thereon can allow direct device attach to the circuit card to be done without reliability concerns from thermal mismatch between the electronic device and the circuit card. Each substrate 4, 6, 8 and 10 is coated with a dielectric material 18. The dielectric material can be a polymer or a ceramic or any other dielectric material. Examples of polymer materials are polyimide, mylar, polyetherimide, polytetrafluoroethylene, epoxy (FR4) and bismaleimide resins. The most preferred materials are polyimides. The polymer materials can be filled or unfilled dielectric material 8 preferably has a thickness from 0.1 mils to about 10 mils.

Examples of suitable polyimides include DuPont Pyralin series of polyimides, Ciba-Geigy Probimides and Rogers Durimid. The encyclopedia of Chemical Technology Third Edition article entitled, "polyimides", Vol. 18, p. 704-719, the teaching of which is incorporated by reference describes various polyimide materials including honopolymers.

Each substrate has a first major surface and a second major surface. Substrate 4 is shown having a major surface 17 and a major surface 20. Substrate 6 is shown having a major surface 22 and a major surface 24. Substrate 8 has a major surface 26 and a major surface 28. Substrate 10 has a major surface 30 and a major surface 32.

Substrate 4 is shown having a metalization pattern 34 on major surface 17 and a metallization pattern 36 on major surface 20. Substrate 4, 6, and 10 are shown having electrical conductor patterns on each major surface. Depending upon the application of the structure 2 it may not be necessary that each substrate have a conductor pattern on each major surface. The pattern on major surface 17 of substrate 4 is electrically connected to conductor pattern 36 on major surface 20 by electrically conducting via 40.

FIG. 1 shows each substrate 4, 6, 8, and 10 having through-holes electrically interconnecting conductor patterns on each major surface. Substrate 4 is electrically interconnected to substrate 6 by electrical connector 42. Electrical connector 42 is bonded between part of conductor pattern 36 on major surface 20 of substrate 4 and conductor pattern 44 on major surface 22 of substrate 6. The electrical connector 42 can be formed from solder mounds, conductive epoxy formulations or conductive elastomer formulations. The electrical connector 42 is preferably a solder mound having dimensions from about 1 to about 20 mils, preferably from about 1 to about 10 mils. Electrical connector 42 leaves a space 46 between each substrate of structure 2.

An electrical connector 42 can be electrically connected to an electrically conducting substrate core. The core can be used as a ground or power plane. Electrical connector 42' is electrically connected to conductor 36' on substrate 4 and conductor 44' on substrate 6. Conductor 36' is electrically connected to core 12 through an aperture in dielectric layer 20 of substrate 4. Conductor 44' is electrically connected to the electrically conductive core of substrate 6 through an aperture on dielectric coating 13 thereon. Alternatively, as will be described below, conductor 44' can be electrically connected to the electrically conductive core along the side wall of the through-hole.

In the preferred embodiment, via 40 is formed from an aperture 49 extending through thermal conducting core 12. The side wall 50 of aperture 49 is coated with dielectric material 51 which is preferably the same material as 18. Electrical conducting material is deposited over dielectric material 51 which coats side wall 50. As shown in FIG. 1, there is typically a space 54 in the center of the aperture 49. The electrically conductive via 40 is formed from the side wall conductor 52. In the preferred embodiment, side wall conductor 52 of via 40 is formed from the same conducting material as metallization layers on the major surfaces of the substrates 4, 6, 8 and 10.

Figure 2:
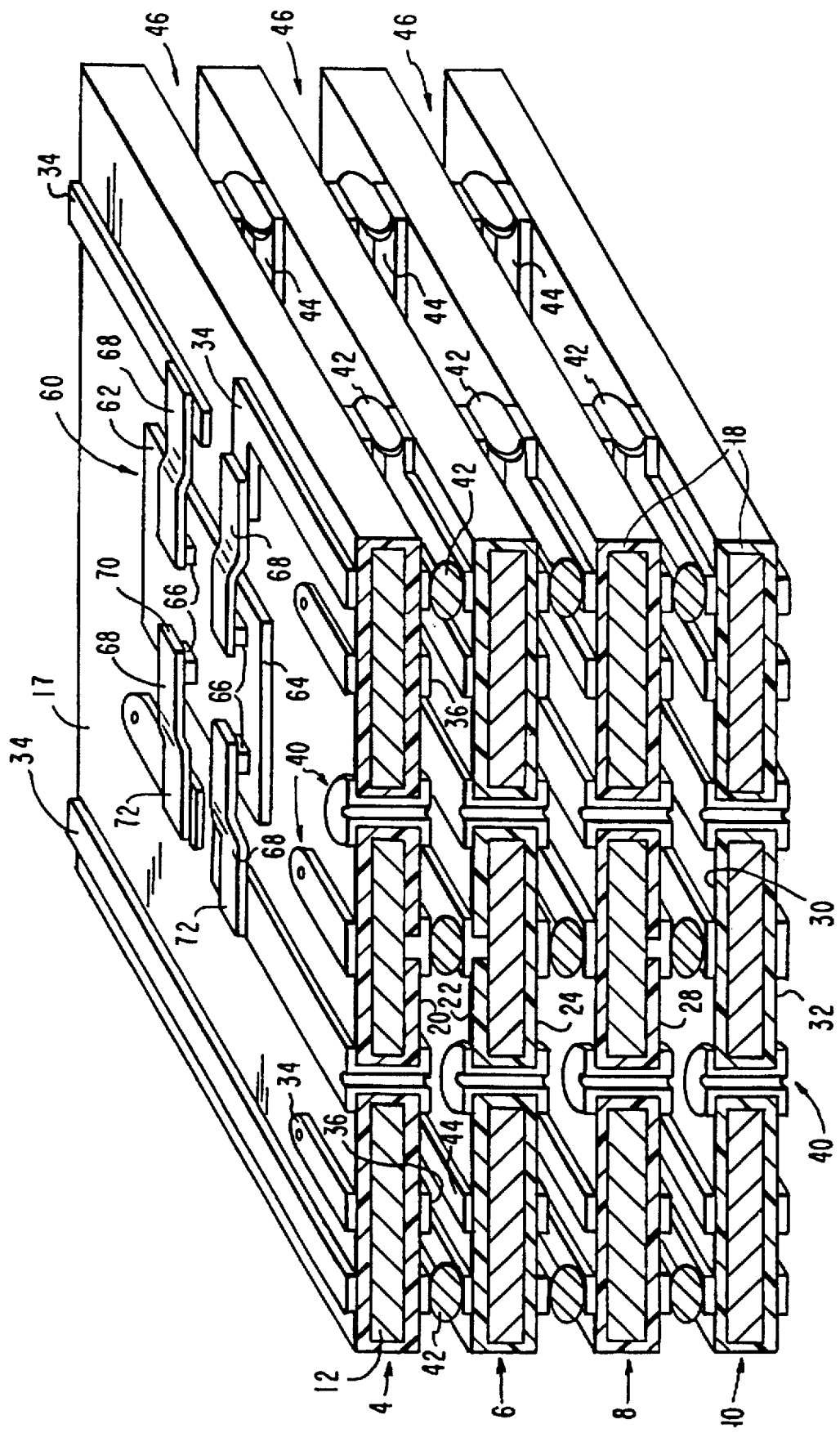
FIG. 2 shows the structure of FIG. 1 with an electronic device mounted thereon.

FIG. 2 shows the structure of FIG. 1 in perspective. All numbers between FIG. 1 and FIG. 2 represent the same feature. In FIG. 2 there is an electronic device 60 mounted on major surface 17 of substrate 4. The active face 62 of electronic device 60 is placed facing away from major surface 17. The back face 64 of electronic device 60 is placed against surface 17 of core 12 through an aperture in dielectric layer 18. Back face 64 of electronic device 60 is thermally mounted onto dielectric layer 18 or to core surface 16 through an aperture in dielectric layer 18 by methods commonly used in the art. Techniques for thermal mounting include but are not limited to the following; applying a thermal grease between back face 64 and surface 17, covering back face 64 with a metal layer and solder bonding the metal layer to a metal layer on surface 17. Active face 62 of electronic device 60 has a plurality of contact pads 66 thereon. A plurality of beam leads 68 electrically interconnect contact pads 66 to metallization pattern 34 on major surface 17 of substrate 4. The inner ends 70 of beam leads 68 can be electrically connected to contact pads 66 on electronic device 60 by any means commonly used in the art, for example, solder bonding and thermocompression bonding. Outer ends 72 of beam leads 68 can be electrically connected to conductor pattern 34 on major surface 16 of substrate 4 by any means commonly known in the art such as solder bonding and thermocompression bonding.

Other techniques for electrically connecting an electronic device 60 to surface 17 can be used. For example, an electronic device 60 can be mounted in a flip-chip-configuration on surface 17 with a plurality of solder mounds, commonly referred to as C4s, between the active face of the electronic device and surface 17. Electronic device 62 can also be electrically connected to conductor pattern 34 on surface 17 by wire bonding discreet electrical wires between contact pads 66 on electronic device 60 and corresponding locations on conductor pattern 34. Electronic device 60 can also be mounted onto a commonly used chip carrier having pins extending therefrom which are electrically connected to the electronic device 60. The pins can be inserted into apertures 54 in an array of vias 40 in substrate 4 or 10.

In the preferred embodiment, the back face of an electronic device is thermally mounted to major surface 17 of substrate 4. During the operation of electronic device, heat is generated which is transferred from the back face of the electronic device to substrate 4. The heat easily passes through the thin dielectric layer 17 of substrate 4. Since substrate 4 has a core 12 of high thermal conductivity material, heat travels throughout substrate 4. The heat travels through the connector 42 to the other substrates 6, 8 and 10. The air space 46 between adjacent substrates permits the heat to escape from substrates 4, 6, 8 and 10 by thermal convection into the air space 46. To enhance the thermal dissipation property of structure 2 a fluid such as air or another gas or a liquid can be passed through spaces 46 to more efficiently carry away the heat generated by electronic device 60. Structure 2 therefore, acts both as a means for connection to electronic device 60 and for dissipating the heat generated by electronic device 60. Since air has a low dielectric constant, space 46 provides a low dielectric constant medium between conductor patterns on adjacent substrates.

FIG. 2 shows one electronic device mounted onto structure 2. A plurality of electronic devices can be mounted onto structure 2. The conductor patterns on the major surfaces on the substrates forming structure 2 are used to electrically interconnect the plurality of electronic devices. The structure of FIG. 2 will have connectors, not shown, typically at an edge of the structure, for electrically connecting the structure 2 and the electronic devices thereon to a frame which electrically interconnects a plurality of boards 2 to form an electronic computer.

The structure of FIG. 1 and FIG. 2 show four important advantages relative to currently used technology;

1. a method for fabrication likely to result in appreciable higher manufacturing yields;

2. a lower effective dielectric constant for the insulation between circuits;

3. compatibility with direct chip attach thereby eliminating a level of packaging;

4. a thermal dissipation capability which would allow the circuit card to take much if not all of the system's heat load;

5. circuitry accessible for repair or engineering change.

These four advantages are inherent in the structure of FIG. 1 and FIG. 2. First, substrates are fabricated separately and can be inspected and tested before being connected to one another. Thus, defective substrates can be discarded or reworked with minimal impact on overall yield.

Also, the interconnection can be a reversible process unlike lamination and drilling of substrates in current technology, so defects in the interconnection can be corrected or eliminated as well.

Second, air has a dielectric constant of 1.0, and therefore the effective dielectric constant of the insulation in the structure of FIGS. 1 and 2 will be a weighted average of the dielectric constant of the air and that of the dielectric insulation covering the thermally conductive cores of the substrate.

Third, the thermally conductive core of the substrates can be chosen to give a coefficient of thermal expansion closely matching that of the electronic device mounted onto the structure of FIG. 1. Where the electronic device is a silicon chip, copper-invar-copper or molybdenum are two possible choices which would allow direct chip attach to the card to be done without reliability concerns from thermal mismatch between the chip and the card.

Fourth, the thermal conductivity of the metal power/ground plane in each substrate will allow effective dissipation of the heat generated by the integrated circuits mounted on the top surface of the card. The heat will be transferred through the top surface polymer film into the substrate interconnections to the other metal plane. The metal planes in each substrate can be interfaced to one end of the card to circulated coolant. For lower power applications, air circulation in the spaces between substrates will be sufficient to dissipate the heat.

A method for fabricating structure 2 of FIG. 1 and FIG. 2 is shown in FIG. 3 to FIG. 7. A clean, substantially planar thermally conductive core 80 is shown in FIG. 3. Core 80 is preferably made of a metal such as copper, aluminum, copper-invar-copper, molybdenum, brass and stainless steel, but is not limited to a metal. The preferred metal is copper or aluminum. The thickness of the metal core is from about 1 to 40. The preferred thickness is from about 2 to about 10 mils.

punch, drill or etch a hole pattern 82 in core 80. Techniques to punch, drill and to etch the hole pattern are commonly known in the art.

If the substrate is to have an electrical connection to metal core 80, a resist material is applied to the core, exposed and developed to selectively remove the resist material. This photolithographic process is commonly practiced in the art. If the substrate is not to have an electrical connection to the metal core 80, this step can be skipped.

Deposit a polymeric material to coat major surface 86 and major surface 88 of core 80 and to coat side walls 84 of through hole 82 with a dielectric material. The preferred dielectric material is a polymeric material. The most preferred material is polyimide. The polymeric material can be deposited to conformally coat core 80 by electrophoretic deposition. Techniques for electrophoretic deposition of polyimide are described in detial in U.S. Pat. No. application Ser. No. 000,278 filed Jan. 2, 1978 to S. L. Buchwalter entitled "polyimides Reaction products and Use in Electrophoretic Deposition" which is incorporated herein by reference.

In the Buchwalter patent application, an aqueous emulsion is formed containing from about 1% to about 10% by weight of an amine-modified polyimide and about 99% to about 90% by weight of water. The amine modified polyimide is a reaction product of an organic soluble polyimide and a polyamine. A polyamine employed is a secondary/tertiary palyamine and/or a primary/tertiary polyamine and/or a protected primary/secondary polyamine. The polyamine employed contains only one secondary amino group or only one primary group available for reaction. This prevents cross-linking of the polyimide which would be detrimental to carrying out the electrophoretic deposition.

The core 80 is dipped into an emulsion as described above. The core 80 acts as a cathode on which polyimide is electrophoretically deposited. The deposition is on the cathode and involves providing an anode such as a carbon rod and an electrically conducting substrate that is to be coated such as a substrate of a metal such as aluminum, copper, stainless steel and providing such in a container containing the above emulsion. The anode and cathode are connected to a DC power source that provides a constant voltage of about 10 volts to about 400 volts , preferably about 50 volts to about 400 volts and most preferably about 50 volts to about 100 volts . The coating is generally completed in about one minute to about 5 minutes and provides a coating thickness of about 5 microns to about 30 microns and preferably about 10 microns to about 30 microns .

After the coated core is removed from the emulsion and rinsed with water, the modified polyimide is subjected to a post-baking in order to remove the remaining water and other organic volatiles in the composition and in order to enhance the coalescence and flow of the film. In addition, the post-baking serves to remove the polyamine used to form the ionic groups in the polyimide. Accordingly the polyimide, after the post-baking, will have little, if any, residual polyamine or acid present. This is desirable to preclude degradation of the thermal and/or electrical properties of the polyimide film. However, minor amounts, such as up to 10% of the polyamine can remain in the film. The polyimide is cured at a temperature from about 100° C. to about 200° C. for about 1 hour to a tack-free state to a point where it can stand up to a subsequent photoresist removal. Following electrophoretic deposition, the resist material is removed. The polyimide is then fully cured by ramping to about 400° C. over 3 to 6 hours and holding at about 400° C. for about 1 hour. FIG. 5 shows core 80 comformally coated with polyimide layer 86. The polyimide layer has a thickness from about 0.1 mils to about 5 mils, preferably from about 0.5 mils to about 2.5 mils. In FIG. 5 region 88 of core 80 is not coated with a polyimide. This location was covered by the resist material during the electrophoretic deposition of the polyimide.

The entire polyimide surface is seeded with a suitable seedable material for example, platinum, palladium, nickel, and the like. The preferred seed material is palladium. U.S. patent application Ser. No. 290,486 filed on Dec. 23, 1988 to Viehbeck et at. entitled "Method for Conditioning an Organic polymeric Material" describes electrochemical and chemical methods for seeding a polymeric material, in particular a polyimide material with a seed material such as palladium. The teaching therein is incorporated herein by reference. The process according to Viehbeck et al. is a method for conditioning at least one surface of an organic polymeric material that is capable of transporting electrons and counter ions in a reversible manner. The process comprises applying electrons to redox sites, i.e., sites which can undergo reduction and oxidation, of the polymeric material with concurrent uptake of counter ions from the electrolyte. The reduced polymeric material is then placed into contact with a solution that contains cations of a metal which will diffuse into the organic polymeric material and contact the redox sites thereof. The redox sites thereby transfer electrons to the cations that are energetically disposed to receiving electrons from the redox sites to thereby reduce the cation to metal atoms in the zero oxidation state. Metal deposited in such a manner can mediate continued electron transfer from the polymer, resulting in further metal deposition near the previously deposited metal. Next, a second metal is deposited from an electroless plating bath onto the zero oxidation state metal.

The electrons are supplied to the redox sites of the polymeric material by either means of a cathode in an electrochemical circuit, the potential applied to the cathode being equal to or negative of the reduction potential of the polymer or preferably by means of a reducing agent and solution, the oxidation potential of the reducing agent being negative with respect to the reduction potential of the polymer. Alternatively, the electrons can be supplied to the redox sites of the polymeric material by contacting the polymeric material with tetrakis(dimethylamino)ethylene. The reducing agent may be in a charged or neutral form. The polymer must possess chemical functionality whose reduction potential is negative relative to the reduction potential of the metal ions. A suitable reducing agent for conditioning the polymer surface is a benzophenone radical anion in acetonitrile containing tetrabutylammonium fluoroborate as electrolyte. This is exemplary only and not limiting. Other examples can be found in the Viehbeck et al. application. Other seeding techniques commonly known in the art can also be used.

By means commonly known in the art, another metal is electrolessly deposited onto the seed layer to form a plating base. Metals such as copper, gold, palladium, silver, nickel and the like can be electrolessly deposited onto the seed layer. The thickness of the electrolessly deposited metal is from about 0.05 micron to about 35 microns , preferably from about 0.1 micron to about 8 microns, most preferably from about 0.1 micron to about 2 microns.

Following deposition of the plating base, a desired pattern can be fabricated by applying, exposing and developing a photoresist prior to electroplating by means commonly known in the art, a metal, for example, copper, gold, silver, cobalt, nickel, and the like onto the exposed electrolessly deposited plating base layer to plate up metal lines onto the exposed plating base. The plated up lines have a thickness from about 0.5 mils . to about 10 ., preferably from about 0.5 mils to about 5 mils , most preferably from about 1 mil to about 3 mils . The plated up lines form electrical conductors 90 in FIG. 6, which are disposed on the surface 92 of dielectric material 86. Electroplated metal 83 also coats the plating base which has been deposited on polymeric side wall 94 of through hole 82, to form electrically conductive via 100. Metal line 102 has been electroplated onto plating base which was deposited onto the seed material in opening 88 of polymeric material 86 providing electrical connection to core 80, as shown in FIG. 6.

The excess plating photoresist is removed by means commonly known in the art. The excess plating base and seed material which is not beneath an electroplated conductor such as 90, 83 and 102 is removed by methods commonly known in the art. Where the plating base is copper, the plating base can be removed by copper etchants such as, ammonium persulfate or ferric chloride. The excess seed material, for example, palladium is highly diffuse and need not be removed but can be removed with nitro acid, if so desired. These are exemplary only and not limiting. The above steps are repeated for each substrate used to fabricate the structure of FIG. 1 and FIG. 2. Where the substrate does not require an electrical connection to the core 80, the first deposition of the resist-like material can be eliminated since no opening such as 88 in polymeric material 86 is required. Each substrate can now be physically and electrically tested prior to assembling into the structure of FIG. 1 and FIG. 2.

In one embodiment of the structure of FIG. 1 and FIG. 2 the substrates 104 and 106 of FIG. 7 are electrically and physically interconnected by solder mounds 108 as shown in FIG. 7. The solder mounds have a diameter from about 1 mil to about 10, preferably from about 2 to about 8 mils, most preferably from about 3 mils to about 8 mils. The spacing between adjacent substrates 104 and 106 approximately corresponds to the diameter of the solder mound used.

The technique for electrically interconnecting substrate 104 and 106 using solder mounds is commonly known in the art of solder reflow controlled collapse chip connection (C-4) technology. U.S. Pat. Nos. 3,401,126 and 3,429,040 to Louis F. Miller and assigned to the assignee of the present patent application, the teaching of which is incorporated herein by reference, describes in detail the controlled collapse chip connection technique of face down bonding of a semiconductor chip to a carrier. The technique described in the Miller patents is directly applicable to electrically connecting substrates 104 and 106. In general, what is described in these patents is a formation of a malleable pad of metallic solder on the semiconductor device contact site and solder joinable sites on the conductors of the chip carrier. The device carrier solder joinable sites are surrounded by non-solderable barriers so that when the solder on the semiconductor device contacts sites melts, surface tension holds the semiconducting device suspended above the carrier.

The surface 110 of conductor pattern 114 on substrate 104 to which solder mound 108 is electrically connected is formed from a solderwettable material such as gold, silver, nickel, cobalt and copper. The surface 112 of conductor pattern 116 on substrate 106 to which solder mound 108 is connected is also formed from the same type of solderwettable materials. The surface of conductor patterns 114 and 106 surrounding the region 110 and 112 respectively to which solder mound 108 is connected is formed from a non-solder-wettable material, for example, oxides of the solder wettable material. When the solder mound is melted to form an electrical connection to services 110 and 112, the solder mound beads up on the solder wetable surfaces 110 and 112 but does not flow out onto the non-solderwettable regions surrounding 110 and 112, thereby maintaining the generally spherical shape of the molten solder mound. A third substrate of the kind shown in FIG. 6 can be mounted using solder mounds onto either surface 122 or surface 124 of structure 120 shown in FIG. 7. Any number of substrates can be electrically and physically interconnected to form a multi-substrate structure as shown in FIG. 1 and FIG. 2. Since the solder mound when molten beads up on the solder wettable surfaces 110 and 112 and maintains a generally spherical shape, the substrates 104 and 106 are physically spaced apart leaving a gap 118 between substrates 104 and 106.

Figure 8:
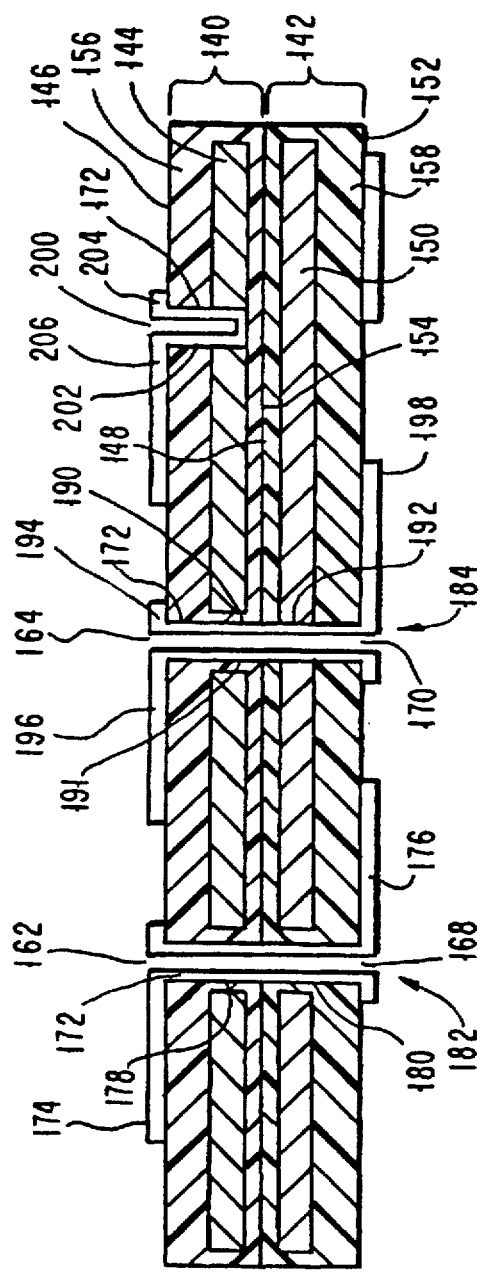
FIG. 8 diagrammatically shows a multi-layer structure of the present invention wherein adjacent substrates are adherently placed together.

FIG. 8 shows another circuit card structure according to the present invention. FIG. 8 shows a circuit card structure having two substrates, 140 and 142, physically and electrically interconnected. Substrate 140 has a thermally and/or electrically conductive core 144. Substrate 140 has a major surface 146 and a major surface 148. Substrate 142 has a thermally and/or electrically conductive core 150 and a major surface 152 and a major surface 154. Major surface 148 of substrate 140 is physically attached to major surface 154 of substrate 142. Major surface 148 can be physically attached to major surface 154 by an adhesive material such as, for example, an a polyimide, e.g., Rogers Durimid (trademark of Rogers Corp.). An adhesive is not necessary if surfaces 148 and 154 adhere directly together. Core 144 of substrate 140 is coated with a dielectric material 156. Substrate 142 is coated with a similar dielectric material 158. Dielectric material can be a ceramic or a polymeric material, preferably a polymeric material, most preferably a polyimide material. Substrate 140 has a plurality of through holes 162, 164 and 200. Substrate 142 has a plurality of through holes 168 and 170. The through hole combination in substrates 140 and 142 of FIG. 8 is exemplary only and not limiting. The side walls of the through holes are coated with a conducting material 172. Through hole 162 in substrate 140 is aligned with through hole 168 in substrate 142 to form a through hole 182 through the structure of FIG. 8. Through hole 162 has dielectric material 178 coating the side wall. Through hole 168 has dielectric material 180 coating the side wall. Dielectric material 178 and 180 are the same as dielectric material 156. The dielectric coating 178 and 180 are lined with conducting material 172 to form a via electrically connecting conducting lead pattern 174 on surface 146 to conducting lead pattern 176 on surface 152. Therefore, the via 182 formed by through hole 162 and 168 is electrically insulated from conducting core 144 of substrate 140 and conducting core 150 of substrate 142.

Via 184 is similar but not identical to via 182. Through hole 170 of substrate 142 is aligned with through hole 164 of substrate 140. Dielectric material 190, which is the same as dielectric material 156, coats the side wall of the through hole 164. There is no dielectric material coating side wall 192 of through hole 170 in substrate 142. Electrically conductive material 194 coats the side wall 191 which is the surface of dielectric material 190 of through hole 164. Electrically conductive material 194 is disposed directly on electrically conductive core 150 of substrate 142 and through hole 184 since the conductive core in through hole 184 is not coated with a dielectric material. Electrically conductive material 194 is electrically connected to electrically conductive material 196 on surface 146 on substrate 140 and is electrically connected to electrically conductive material 198 on surface 152 of substrate 142. Therefore, electrically conductive material 194 forms an electric conductive via between conductor 196 and conductor 198 and also an electrical connection to electrically conducting core 150 of substrate 142.

The electrically conductive vias can electrically connect the conductor patterns on outside surfaces 146 and 152 and the conducting cores of each substrate. The core of one substrate can be connected to one or more cores of other substrates. The conductor pattern on an outside major surface can be connected to one or more cores. The conductor patterns on the outside major surfaces can be connected.

Through hole 200 in substrate 140 is not aligned with a through hole in substrate 142. The part of through hole 200 passing through electrically conducting core 144 of substrate 140 is not coated with a dielectric material. The side wall 202 of through hole 200 is coated with a electrical conductor 204 which is electrically connected to electrical conductor 206 on surface 146. Therefore, electrical conductor 204 and through hole 200 forms an electrical conducting via electrically connecting conductor 206 to core 144.

An electronic device can be mounted onto surface 146 or surface 152 of the structure of FIG. 8 in a similar manner as the electronic device is mounted onto surface 17 of the structure of FIG. 2. Electrically conducting cores 144 and 150 can function as ground and power plane for the structure of FIG. 8. Thermally conductive cores provide a heat sink for dissipation of power generated by the electronic device. Although the structure of FIG. 8 shows two substrates 140 and 142 forming the structure of FIG. 8, it will be apparent to those of skill in the art that any number of substrates can be used to make a multi-layered substrate structure of FIG. 8 by disposing substrates such as shown in FIG. 5 between substrates 140 and 142 of FIG. 8.

Each substrate of the structure of FIG. 8 can be fabricated in similar fashion to the substrates of FIG. 1 and FIG. 2. process steps as shown and described with regard to FIG. 4, FIG. 5 and FIG. 6 are the same except that no resist steps are necessary to make contact to the cores in the through-holes.

The structures of FIG. 1 and FIG. 8 can be combined. One or more of the substrates 4, 6, 8 and 10 of FIG. 1 can be replaced by the structure of FIG. 8 which is an assembly of substrates which are not spaced apart. The resulting structure contains a plurality of assemblies each containing at least one substrate, having a plurality of connectors electrically interconnecting and spacing apart the assemblies.

Figure 9:
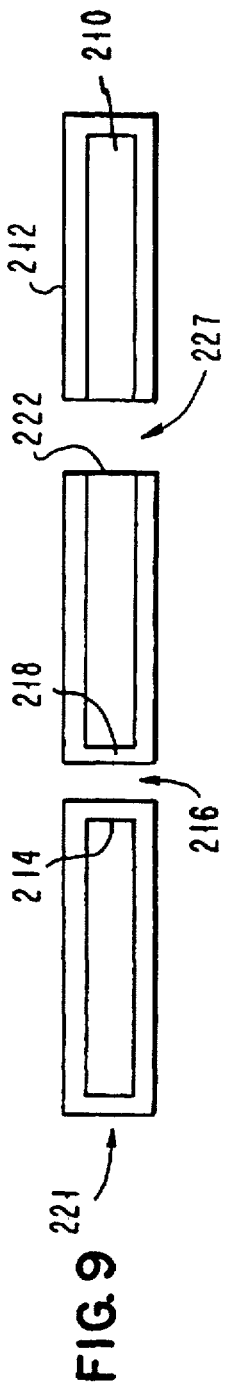
FIG. 9 shows through-holes on the structures of FIG. 1, FIG. 2 and FIG. 9.

Referring to FIG. 9, electrically conducting core 210 has been coated with dielectric material 212. Sidewall 214 of through hole 216 is coated with dielectric material 218. To form a through hole which does not have side wall coated with dielectric material, the through hole is punched, etched or drilled into substrate 221 of FIG. 9 after dielectric material 212 has been deposited onto core 210. This type of through hole is shown as 227 in FIG. 9. Thereafter, the metallization process to form the conducting material coating the side wall of the through holes to form conducting vias either in dielectric coated through hole 216 or nondielectric coated through-hole 227 is the same as has been described and shown with reference to FIG. 6. The core is preferably made of a material such as copper, gold, silver, cobalt and other materials which provide a plating base. The preferred material is copper.

To fabricate the structure of FIG. 8, the individual substrates such as shown in FIG. 9 are disposed with the major face of one placed against the major face of an adjacent substrate with corresponding through holes aligned. Thereafter, the metallization processes are performed to form the conducting via material and the conducting material on major surfaces 146 and 152 of FIG. 8.

Figure 10:
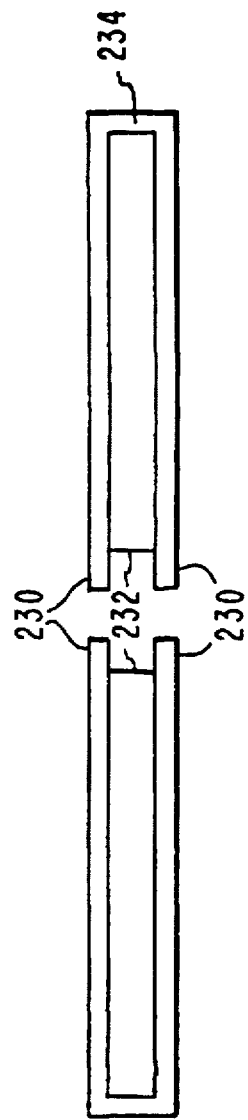
FIG. 10 shows a more particular embodiment of the through holes of FIG. 10.

An alternate method for applying dielectric on the side wall of a through-hole in a substrate is to deposit a liquid polymeric material onto both major surfaces of a conducting core. The polymeric material can be deposited by roll coating the liquid polymer onto the conducting core, this is a commonly used technique in the art. Thereafter, a through hole is punched, drilled or etched through the polymeric material and the conducting core. The conducting core with the through hole is then subsequently dipped into a dilute solution of the polymeric material to deposit on the side wall of the through hole a coating of the dielectric material. The substrate is dipped sequentially into the liquid polymer to build up the thickness of the side wall dielectric material. The liquid polymeric material is then cured or the liquid polymeric material can be cured after each dipping into the dilute liquid polymeric solution. To enhance the retention of the liquid polymeric material along the side wall of the through hole, the conducting core can be etched back as shown in FIG. 10 to leave the overhang of polymeric material 230 on either side of the through hole. The overhang has been exaggerated for clarity. The overhang provides a crevice 232 which traps the liquid polymeric material when the substrate 234 is dipped into the dilute solution of the liquid polymeric material. This results in a sidewall thickness of greater uniformity. With the crevice and overhang the substrate 234 has to be dipped into the liquid polymeric solution fewer number of times. Examples of the liquid polymeric solution include the DuPont pyralin polyimide precursor solutions, Ciba-Geigy probimide solutions and National Starch and Chemical Thermid solutions. These solutions can be diluted to appropriate concentrations with suitable solvents such as N-methylpyrrolidinone, dimethyl acetamide, or diethyleneglycol dimethyl ether. Appropriate concentrations are from about 1% to about 25% polymer by weight, preferably from about 3% to about 15%.

Electrically conducting vias of the type 200 in FIG. 8 for providing electrical connection to an electrically conductive core can be used in the structures of FIG. 1 and FIG. 2.

Another alternative method for applying a dielectric material on the sidewall of a through-hole in a substrate is described in copending U.S. patent application Ser. No. 339,557 now issued as U.S. Pat. No. 5,208 068 entitled "Lamination Method For Coating the Sidewall or Filling A Cavity In A Substrate" to Davis, et al. filed on the same day as the present application, the teaching of which is incorporated herein by reference.

Davis et al. describes a method for pressing a material into a through-hole or blind-hole in a substrate. The material is disposed on the surface of the substrate. An environment is provided permitting the material to flow, for example, by heating the material to the glass transition temperature or above. Thereafter pressure is applied causing the material to flow, first coating the sidewall of the hole and on the continued application of pressure the material flows to completely fill the hole. The resulting substrate can have a substantially planar surface having holes with the periphery coated with or completely filled with the material. The material is preferably a thermoplastic polymeric material such as a polyimide and a perfluorinated polymer.

A substrate 80 as shown in FIG. 3 is coated on both sides with a dielectric layer such as DuPont pyralin PI 2525 which is a thermoplastic polymer. A through-hole such as shown in 221 of FIG. 9. If the hole is punched the substrate material can be smeared in the direction of movement of the punch. The smeared material can be removed by etching to leave the polymer over hanging the through-hole in the substrate as shown in FIG. 10. The substrate is then placed between two platens, the polymer is heated to the glass transition temperature or above and the platens are pressed together putting pressure on the polymer layer forcing it into the through-hole. As described in detail in the application to Davis et al., the polymer first coats the sidewall. After sufficient time the through-hole is completely filled. A through-hole with a dielectric coating can be formed by either stopping the pressure when the sidewall is coated or forming a hole, by the same methods as above, through the polymer which fills the through-hole in the substrate. The following are examples of using this method to coat a through-hole sidewall and filling a through-hole.

EXAMPLES

EXAMPLE 1

DuPont pyralin PI 2525, a thermoplastic polyimide, was dip coated onto a 0.003 inch copper foil. Approximately 0.0005 inch polymer thickness results from each dip. Multiple dips were used to achieve a 0.001 inch and a 0.002 inch final polymer thickness on both sides of the copper foil. Both samples were baked at 200° C. for 5 minutes between each dip coat and after the last coating is complete. Through-holes, having a diameter of 0.005 inches, were mechanically punched through each sample. These exposed the copper core inside the through-hole. The copper core was etched back by dipping the sample for 4 minutes in ferric chloride at 50° C. The samples were then copiously rinsed with the de-ionized water and then dried. The samples were heated above $T_g$ 310° C. and pressed between two platens. For samples with the 0.001 inch polymer thickness 5,000 psi at 350° C. for 15 seconds was used. For samples with 0.002 inch polymer thickness 5,000 psi at 340° C. for 10 seconds was used.

EXAMPLE 2

Dip coat polyamic acid 5811D, manufactured by DuPont which is a BPDA-PDA polyimide precursor onto one ounce prepunched, copper-invar-copper core. The core has a sputtered chromium surface. The coated core is baked at 85° C. for one hour. The core is then pressed at 750 psi at 125° C. for 45 minutes and then pressed at 750 PSI at 250° C. for one hour to fill the punched holes with the polymer.

In summary, the invention herein is a multi-layered structure useful as an electronic circuit card for mounting thereon electronic devices. The electronic circuit card is fabricated from a plurality of substrates each of which has an electrical and/or thermally conductive core surrounded by a thinner layer of dielectric material. In one embodiment the substrates are electrically interconnected by connectors which space the substrates apart, thereby providing a space through which a cooling fluid can pass to extract heat generated by the electronic device in the structure. In another embodiment of the invention, substrates are placed against each other. Electrically conducting cores provide stability to the structure and provide ground and power planes to the structure. In another embodiment of the invention, a plurality of assemblies are electrically interconnected and spaced apart by a plurality of connectors. The assemblies can have more than one substrate placed against each other.

While the invention has been illustrated and described with respect to preferred embodiments, it is to be understood that the invention is not limited to the precise construction herein disclosed, and the rights are reserved to all changes and modifications coming within the scope of the invention as defined in the appended claims.

Having thus described our invention, what we claim as new and desire to secure as Letters Patent is:

1. An electronic device mounting structure comprising:
   a plurality of substrates, each having a major surface, each of said substrates having a thermally conductive core;
   a dielectric material on a major surface of said conductive core;
   a major surface of one of said plurality of substrates facing a major surface of another of said plurality of substrates so that there are adjacent major surfaces each having said dielectric material;
   an electrical conductor pattern on each of said dielectric-coated adjacent major surfaces, at least one of said electrical conductor patterns being electrically connected to at least one of said conductive cores;
   a plurality of malleable connectors disposed between and spacing apart said adjacent major surfaces to form a thermal conduction path therebetween; and
   a part of said plurality of malleable connectors electrically connecting a part of said conductor patterns on said adjacent major surfaces.

2. The structure of claim 1, wherein said at least one core is electrically conductive.

3. The structure of claim 1, wherein said core is a material selected from one or more of Cu, Al, Cu-Invar-Cu, Mo and alloys thereof.

4. The structure of claim 1, wherein said conductive core has a thickness from about 0.1 to about 40 mils.

5. The structure of claim 1, further including an electronic device electrically mounted onto one of said plurality of said substrates.

6. The structure of claim 5, wherein said device is mounted in thermal contact to one of said plurality of said substrates.

7. The structure of claim 1, wherein at least one of said substrates has at least one electrically conductive via therein to provide electrical connection between said first and second major surface.

8. The structure of claim 1, wherein said dielectric material is a polymeric material.

9. The structure of claim 6, wherein said polymeric material is filled.

10. The structure of claim 8, wherein said dielectric material has a thickness of from about 0.1 mil to about 10 mils.

11. The structure of claim 8, wherein said polymeric material is selected from the group of a polyimide and a fluoropolymer.

12. The structure of claim 7, wherein said electrically conductive via is electrically insulated from said at least one core.

13. The structure of claim 12, wherein said electrically conducting via is formed from a through-hole in at least one of said substrates having an electrically insulating material disposed about the periphery of said through-hole and an electrically conductive material disposed thereover.

14. The structure of claim 7, wherein said electrically conductive via is electrically connected to said at least one core.

15. The structure of claim 14, wherein said electrically conducting via is formed from a through hole in said at least one of said plurality of said substrate, said through hole having an electrically conductive material disposed about the periphery thereof.

16. The structure of claim 1, wherein at least one of said plurality of connectors is electrically connected to said at least one core.

17. The structure of claim 1 wherein said conductor pattern of at least one of said plurality of said substrates is electrically connected to said core of said at least one of said plurality of said substrate through an opening in said dielectric material.

18. The structure of claim 1, wherein said plurality of connectors are selected from the group consisting of a solder mound, a mound of conductive epoxy and a mound of an elastomer having metal embedded therein.

19. The structure of claim 12, wherein said solder mound has a diameter from about 2 mil to about 20 mils.

20. The structure of claim 14 wherein said electrically insulating material about said through-hole is a polymeric material.

21. The structure of claim 1, wherein at least one of said substrates comprises:

plurality of substrates, each having a major surface;

each of said substrates having a conductive core, there being a dielectric material on a surface of said conductive core;

a major surface of one of said plurality of substrates facing and adhering to a major surface of another of said plurality of substrates with a dielectric material therebetween;

an electrical conductor pattern on at least one of said major surfaces electrically connected to at least one of said conductive cores.

22. The structure of claim 1, wherein said at least one conductor pattern is connected to said at least one core through an opening in said dielectric material around the periphery of a through-hole extending into said core.

23. The structure of claim 1, wherein said at least one conductor pattern is connected to said at least one core through an opening in said dielectric material on said major surface.

24. An electronic device mounting structure comprising:

a plurality of substrates, each having a major surface, each of said substrates having an electrically and thermally conductive core;

a dielectric material on a major surface of said conductive core;

a major surface of one of said plurality of substrates facing a major surface of another of said plurality of substrates so that there are adjacent major surfaces forming a stack of substrates, said stack having two end major surfaces;

an electrical conductor pattern on each of said adjacent major surfaces, at least one of said electrical conductor patterns being electrically connected to at least one of said conductive cores;

a plurality of malleable solder mounds disposed between and spacing apart said adjacent surfaces and forming a thermal conduction path therebetween;

a part of said plurality of malleable solder mounds electrically connecting a part of said conductor patterns on said adjacent major surfaces;

an electronic device having a back face and an active face mounted on one of said major surfaces, said active face having contact locations thereon, said back face mounted in thermal contact to one of said end major surfaces of said structure; and conducting leads electrically connecting said contact locations of said active face of said electronic device to said conductor pattern on at least one of said end major surfaces.

* * * * *